United States Patent [19]

Yanagimoto et al.

[11] Patent Number: 4,634,655

[45] Date of Patent: Jan. 6, 1987

[54] METHOD OF FORMING CORROSION RESISTANT FILM ON THE SURFACE OF SUBSTRATE COMPOSED OF COPPER OR COPPER ALLOY

[75] Inventors: Katsutoshi Yanagimoto; Shoichi Nagai, both of Hikone, Japan

[73] Assignee: Dainippon Screen Mfg. Co., Ltd., Kyoto, Japan

[21] Appl. No.: 734,441

[22] Filed: May 15, 1985

[30] Foreign Application Priority Data

Jun. 4, 1984 [JP] Japan .................................. 59-115169
Feb. 6, 1985 [JP] Japan .................................. 60-22164

[51] Int. Cl.$^4$ ........................ G03C 1/495; G03C 1/68; G03C 1/71; G03C 1/76
[52] U.S. Cl. ..................................... 430/277; 148/6.2; 430/287
[58] Field of Search .................. 148/6.2; 430/270, 277, 430/287

[56] References Cited

U.S. PATENT DOCUMENTS 2,787,546 4/1957 Smith et al. .......................... 430/287
4,517,277 5/1985 Lynch et al. .................... 430/287 X

FOREIGN PATENT DOCUMENTS 45-9614 4/1970 Japan ................................... 430/287

OTHER PUBLICATIONS

Luzzi, J. J., *Photosensitive Compositions*, IBM, vol. 9, No. 4, Sep. 1966.

Primary Examiner—Michael R. Lusignan
Attorney, Agent, or Firm—Brumbaugh, Graves, Donohue & Raymond

[57] ABSTRACT

A method of forming a corrosion resistant film for a specified image on the surface of a substrate by adding an aliphatic amine such as ethylenediamine, monoethanolamine, diethanolamine triethanolamine to a sensitizing solution composed of water-soluble high molecular compound and ammonium dichromate so as to adjust pH value of the sensitizing solution in the range of 6.1 to 7.8, applying the prepared sensitizing solution to the surface of a substrate of copper or copper alloy, and undergoing each process of drying, exposure and development. After an etching process being applied to the substrate on the surface of which the corrosion resistant film has been formed, the corrosion resistant film is removed to be a finished goods.

3 Claims, No Drawings

METHOD OF FORMING CORROSION RESISTANT FILM ON THE SURFACE OF SUBSTRATE COMPOSED OF COPPER OR COPPER ALLOY

BACKGROUND OF THE INVENTION

This invention relates to a method of forming a corrosion resistant film (resist) on the surface of a metal plate, and more particularly to a method of forming a corrosion resistant film on a sheet-like or web-like surface of substrate composed of copper or copper alloy by using sensitizing solution composed of water-soluble high molecular compound such as polyvinyl alcohol (hereinafter referred to as "PVA"), casein, glue or the like and ammonium dichromate (hereinafter referred to as "ADC"). The method according to this invention is applied to photoetching of copper or copper alloy.

When PVA-ADC sensitizing solution composed of water-soluble high molecular compound (hereinafter represented by PVA) and ADC is used for forming a corrosion resistant film for photoetching mild steel material or invar steel to be used as shadow mask or the like, such problem as fog (unnecessary curing) caused by dark reaction or continuing reaction (curing without exposure) does not occur in practical use. That is, even in such a case that after degreasing the surface of mild steel material or invar steel, PVA-ADC sensitizing solution is applied to the surface of substrate and is dried, then after leaving for 4 days as it is (4 days leaving after coating) it is photographically printed, and further after leaving 2 days as it is (2 days leaving after printing) it is developed, the fog does not occur and as a result next etching process does not suffer from any inconvenience.

On the other hand, when applying said PVA-ADC sensitizing solution to a copper or an alloy containing copper, at the step of leaving after coating or leaving after printing, a dark reaction or a continuing reaction is taken place, and a fog is caused thereby, making the photoetching process difficult. Concerning this phenomenon of fog, when PVA alone or ADC alone is applied to the copper or copper alloy, the progress of the dark reaction is very slow, but when a sensitizing solution composed of PVA and ADC mixed with each other is applied to a substrate of copper or copper containing alloy, the dark reaction is immediately taken place and a corrosion resistant film is formed.

Such being the case, when applying a photoetching process to a copper or copper alloy, it is usual to apply either (I) PVA-ADC sensitizing liquid on condition that the leaving after coating or leaving after printing is not effected or (II) an organic solvent photoresist or the like of which catalytic reaction is slow on the copper or copper alloy (For example, KMER, KTFR produced by Eastman Kodak Company or FPR produced by Fuji Chemicals Industrial Co., Ltd.). Even when employing these methods, since a problem still remains in that the metal surface is coated with a metal oxide film or sticked by a very thin resist film. In order to remove them it is necessary to expose the metal surface to be worked as a pretreatment or preliminary process of etching process (hereinafter referred to as "preetch"). Particularly when the image line width of a printed pattern is so fine as to be 50 $\mu$m and less, said preetch treatment is indispensable.

In addition, when applying photoetching to a substrate of copper or copper alloy material, there are following problems to be overcome:

(I) In the developing process by using PVA-ADC sensitizing liquid and without leaving after coating or leaving after printing, it is necessary to have a consecutive treating apparatus, and therefore, 1. The overall length of the equipment becomes longer.

2. When trouble occurs in the apparatus, it must be stopped, and besides since the substrate under the developing process may suffer from a fog caused by the dark reaction, an economic loss caused by such defective product is considerable, and in addition it is troublesome to start again the apparatus.

3. Once the process has been started, the operation must be continued up to the final step, and an inconvenience exists in that it is impossible to tempolarlily preserve or pool an intermediate product by each step of the developing process. Such inconvenience is considerable particularly in case of a substrate composed of web-like material.

(II) Meanwhile, in case of a developing process using an organic solvent photoresist, 1. The cost of photoresist is high, and since the developing solution is an organic solvent which is expensive being quite different from water, the manufacturing cost on the whole is increased.

2. So far as an organic solvent is used, there is the possibility of inflammation, and therefore it is necessary to take sufficient measures in view of security as well as industrial hygiene.

SUMMARY OF THE INVENTION

In view of the above-discussed problems, it is an object of this invention to provide a novel and useful method of forming a corrosion resistant film on the surface of a substrate of copper or copper alloy, irrespective of the shape of material whether it is sheet-like or web-like.

When a corrosion resistant film is formed on the surface of a substrate of copper or copper alloy by the method proposed by this invention, the manufacturing cost is rather reasonable and even in case of undergoing such process as leaving after coating or leaving after printing, a successful etching is secured without fog phenomenon despite that any measures in view of security and hygiene is not necessary.

A method of forming a corrosion resistant film according to this invention comprises a step of applying a sensitizing solution composed of water-soluble high molecular compound such as PVA and ADC to the surface of a substrate composed of copper or copper alloy and drying it, and a step of exposing and developing it so as to form a corrosion resistant film for a specified image, in combination with a step of adding aliphatic amine to said sensitizing solution so that pH value of the sensitizing solution is prepared to be 6.1 to 7.8.

Other features and advantages of this invention will become apparent in the course of the following description of preferred embodiments of this invention given in conjunction with the accompanying tables.

DESCRIPTION OF THE PREFERRED EMBODIMENTS

In a method of forming a corrosion resistant film according to this invention, with respect to a process of applying a sensitizing solution to the surface of a substrate and drying it, a process of exposing and printing a desired pattern, and a process of forming a corrosion resistant film for a specified image by applying a developing treatment, any of known method is available.

According to the invention, a sensitizing solution composed of a water-soluble high molecular compound such as polyvinyl alcohol and ammonium dichromate (ADC) is used, and the pH value of the sensitizing solution is adjusted to be 6.1 to 7.8 by adding aliphatic amine thereto. Such aliphatic amine as ethylenediamine, monoethanolamine, diethanolamine, triethanolamine is used in said adding step, but not limited thereto. These aliphatic amines are water-soluble, and the aqueous solution thereof is alkaline. The available aliphatic amine is not limited to a material of pure aliphatic amine, but any other material of which principal component is aliphatic amine such as Proxel CRL (produced by Imperial Chemical Industries Limited) commercially obtained. In this connection, when using any alkaline material other than aliphatic amine by preparing the pH value to be as aforementioned, any technical advantage performed by this invention is not achieved.

When the adjusted pH value in the sensitizing solution is increased, unless changing the exposing and printing time, the strength of the formed corrosion resistant film is declined, and the film is easily peeled from the substrate surface. Therefore when the pH value in the sensitizing solution is high, it is necessary to prolong the exposing and printing time as accordingly within the tolerance thereof so as to improve the strength of the film (it is well known that the more the exposure time, the more the strength of the film).

When a sensitizing solution prepared by the method of this invention is applied to the substrate surface and dried, and after a specified pattern being exposed and printed for a required time, it is developed, there is no such disadvantage as peeling of photosensitive film at the step of development and washing, nor such phenomenon as fog in case of leaving after coating or leaving after printing for several days, and as a result it becomes possible to apply successfully an etching process thereto.

Now, described hereunder are example of this invention and the results obtained by comparative experiments. The scope of this invention, however, is not restricted to these example and experiments.

(1) 1 l of 10% aqueous solution of PVA (DS-14 produced by Fuji Chemicals Industrial Co., Ltd. was used) was mixed with an aqueous solution prepared by dissolving 8 g of ADC in 50 ml of water, and 4,500 ml of sensitizing solution was obtained. Then, a proper quantity (not more than 1 Wt./Vol. %) of alkali was added to each separated solution of said solution. Said alkali was one of 5 kinds of alkalis, i.e., (a) caustic soda, (b) aqueous ammonia, (c) ethylenediamine, (d) triethanolamine, or (e) said Proxel CRL (produced by Imperial Chemical Industries Limited), and the pH value for each of them is prepared to be 6.1, 6.3, 6.5, 6.7, 7.0, 7.3, 7.5, 7.8 or 7.9. In effect, for each of said 5 kinds of alkalis, 45 separated solutions of 9 pH values in total are prepared as sensitizing solutions.

(2) 100 ml of each of said sensitizing solution was applied to each of 45 copper foils (sheet-like material) of which surface was treated preliminarily using aqueous solution of sulfate after being degreased by alkali or trichloroethylene by means of a rotary applicator (whirler) and was dried. When the revolution of the whirler was 70 r.p.m, a copper foil coated with said each photosensitive film of 5 μm in thickness was obtained.

(3) Then each copper foil coated as above described was left for 4 days in a room under a yellow color safety lamp at the room temperature of 24° C. and the relative humidity between 45–50% (4 days leaving after coating).

(4) After 4 days, each copper foil was taken out of the room, and was printed by exposing for 34 sec. for each prepared solution of pH 6.1–7.3 and for 40–80 sec. for each prepared solution of pH 7.5–7.9 under a metal halide lamp of 4 KW at the distance of 57 cm therefrom by means of a micro pattern composed of a single-line screen of 30–50 μm (black line) arranged at the pitch of 300–400 μm.

(5) Left for 2 days in the room of (3) (2 days leaving after printing).

(6) After 2 days, each exposed copper foil was taken out of the room, and (i) a spray developing process (under the pressure of 1 kg/cm$^2$) was applied thereto for 1 min. using a city water heated up to 20° C.;

(ii) then after being immersed in 4 Wt/Vol % aqueous solution of chromic acid anhydride for 40 sec. for film hardening;

(iii) a spray washing treatment (under the pressure of 1 kg/cm$^2$) was applied for 50 sec. using city water heated up to 20° C. to wash out unnecessary chromic anhydride;

(iv) after dewatering, for the purpose of intensifying the corrosion resistance of the film, a burning treatment was applied at 120° C. for 4 min.; and (v) after applying a suitable preetch treatment, an etching was applied using aqueous solution of ferric chloride.

Said preetching treatment is, for example, effected by washing after each copper foil treated as above described being immersed in a mixed aqueous solution of caustic soda of which density is not less than 4 Wt./Vol.% and potassium permanganate of which density is not less than 1 Wt./Vol.% for 2 min. at normal temperature. It is also possible to effect the preetch treatment using a mixed aqueous solution of caustic soda and red prussiate in place of said mixed aqueous solution of caustic soda and potassium permanganate.

Following Tables 1-1, 1-2, 2-1, 2-2 show a state of etching with respect to each copper foil after being applied a series of above-described treatments, respectively:

TABLE 1-1

| Kind of alkali | Sensitizing solution pH | | |
|---|---|---|---|
|  | 6.1 | 6.3 | 6.5 |
| (a) Caustic soda | not etched | not etched | not etched |
| (b) Aqueous ammonia | not etched | not etched | not etched |
| (c) Ethylenediamine | etched | etched | etched |
| (d) Triethanolamine | partially not etched but substantially etched | etched | etched |
| (e) Proxel CRL (trade name) | etched | etched | etched |

TABLE 1-2

| | 6.7 | 7.0 | 7.3 |
|---|---|---|---|
| (a) | not etched | not etched | not etched |
| (b) | not etched | not etched | not etched |

TABLE 1-2-continued

| | 6.7 | 7.0 | 7.3 |
|---|---|---|---|
| (c) | etched line sharpness excellent | etched line sharpness excellent | etched, but film slightly raised |
| (d) | etched line sharpness excellent | etched film slightly raised | film peeled at washing in developing process |
| (e) | etched line sharpness excellent | etched line sharpness excellent | etched, but film slightly raised |

TABLE 2-1

| Kind of alkali | Sensitizing solution pH 7.5 |
|---|---|
| (a) Caustic soda | not etched |
| (b) Aqueous ammonia | not etched |
| (c) Ethylenediamine | etched when exposed 40 sec., but film slightly raised |
| (d) Triethanolamine | film peeled at washing in developing process when exposed 40 sec.; etched when prolonged exposing time to 60 sec., but film slightly raised |
| (e) Proxel CRL (trade name) | etched when exposed for 40 sec., but film slightly raised |

TABLE 2-2

| | 7.8 | 7.9 |
|---|---|---|
| (a) | not etched | not etched |
| (b) | not etched | not etched |
| (c) | etched, when exposed 40 sec., but film slightly raised | not etched; film peeled at washing in development even when prolonged exposing time to 80 sec. |
| (d) | etched when exposed 60 sec., but film slightly raised | not etched; film peeled at washing in development even when prolonged exposing time to 80 sec. |

As is obvious from the above tables, when caustic soda or aqueous ammonia was added, a dark reaction (or continuing reaction) was caused by the contact of copper with sensitizing solution to the extent of occurance of fog, making it impossible to apply it in practical use.

On the other hand, in case of using the sensitizing solution of which pH value was adjusted by adding aliphatic amine, as is shown in Tables 1-1, 1-2, when exposing for 34 sec., etching became possible in the range of pH 6.1–7.3, and in particular satisfactory results were obtained in the range of pH 6.7–7.0.

Further, as is shown in Tables 2-1, 2-2, in the range of pH not more than 7.8, when the pH value was raised, etching was impossible by prolonging the exposing time. In case of pH not less than 8, etching may be possible without film peeling at the time of developing and washing by prolonging the exposing time to not less than 80 sec. However, since the time necessary for the exposure is twice as much as the case where 40 sec. of exposure is enough for etching, such etching is useless in view of industrial production or productivity, and therefore any experiment was not made under such conditions.

In addition, when adding a double salt of aliphatic amine such as hexamethylenediamine dihydrochloride to a sensitizing solution, pH of the solution was not changed or adjustable, and prevention of fog was not achieved. Aromatic amine is not useful since it is refractory against water.

In the foregoing example, aqueous solution of PVA is used as a water-soluble high molecular compound, but when using such other material as albumen, casein, glue, gelatine, the same result is obtainable. However, in case of casein, glue or the like, a high temperature process at not less than 200° C. is required in the burning process of the development, and therefore it is to be noted that there is the possibility of softening depending on the copper material.

We claim:

1. A method of forming a corrosion resistant film on the surface of a substrate composed of copper or copper alloy comprising
   (a) applying to the substrate a solution comprising
      (i) a film forming amount of a water-soluble high molecular weight compound,
      (ii) ammonium dichromate in an amount effective to achieve sensitization of the solution, and
      (iii) an amount of an aliphatic amine sufficient to adjust the pH of said solution to between 6.1 and 7.8;
   (b) drying the solution-coated substrate such that a photosensitive film is formed on the substrate;
   (c) exposing the photosensitive film to light; and
   (d) developing the exposed film so as to form said film for a specified image.

2. A method of forming a corrosion resistant film claimed in claim 1, wherein said water-soluble high molecular weight compound is polyvinylalcohol.

3. A method according to claim 2, wherein the aliphatic amine is selected from the group consisting of ethylenediamine, monoethanolamine, diethanolamine and triethanolamine.

* * * * *